(12) United States Patent
Lachapelle

(10) Patent No.: US 10,299,408 B1
(45) Date of Patent: May 21, 2019

(54) COOLING SYSTEM FOR A BUILDING

(71) Applicant: Amazon Technologies, Inc., Seattle, WA (US)

(72) Inventor: Alan Joseph Lachapelle, Reston, VA (US)

(73) Assignee: Amazon Technologies, Inc., Seattle, WA (US)

( * ) Notice: Subject to any disclaimer, the term of this patent is extended or adjusted under 35 U.S.C. 154(b) by 536 days.

(21) Appl. No.: 14/820,122

(22) Filed: Aug. 6, 2015

(51) Int. Cl.
H05K 7/20 (2006.01)
G06F 1/20 (2006.01)

(52) U.S. Cl.
CPC ..... H05K 7/20709 (2013.01); H05K 7/20745 (2013.01); H05K 7/20836 (2013.01); G06F 1/20 (2013.01); Y10T 29/53 (2015.01)

(58) Field of Classification Search
CPC .......... H05K 7/20709; H05K 7/20836; H05K 7/20745; Y10T 29/53; G06F 1/20
See application file for complete search history.

(56) References Cited

U.S. PATENT DOCUMENTS

| | | | | |
|---|---|---|---|---|
| 1,949,735 A | * | 3/1934 | Bulkeley | F24F 3/02 165/249 |
| 2,238,924 A | * | 4/1941 | Bennett | F28D 5/02 165/181 |
| 2,363,578 A | * | 11/1944 | Dieter | F24F 3/14 261/112.1 |
| 3,979,922 A | * | 9/1976 | Shavit | F24F 3/0525 62/97 |
| 4,103,508 A | * | 8/1978 | Apple | F24F 3/14 62/92 |
| 4,562,015 A | * | 12/1985 | Lefevre | B01J 19/32 261/112.2 |
| 5,030,423 A | * | 7/1991 | Obee | B01D 53/75 422/122 |
| 5,248,454 A | | 9/1993 | Thomas | |
| 6,508,303 B1 | * | 1/2003 | Naderer | F24F 11/77 165/299 |
| 6,523,604 B1 | * | 2/2003 | Brooks | F28D 5/00 165/110 |
| 7,296,785 B2 | * | 11/2007 | Hayden | B05B 17/085 261/105 |
| 7,430,118 B1 | * | 9/2008 | Noteboom | H05K 7/20745 361/695 |
| 7,669,838 B2 | * | 3/2010 | North | F24F 3/14 261/112.2 |

(Continued)

OTHER PUBLICATIONS

Humicool Division GLASdek with TUFedg. Product information [online]. Munters Corporation, 2000 [retrieved on Jul. 30, 2015]. Retrieved from the Internet: http://indamex.mx/datostecnicos/252Glasdek-Celdek.pdf, 4 pages.

(Continued)

Primary Examiner — Frantz F Jules
Assistant Examiner — Martha Tadesse
(74) Attorney, Agent, or Firm — Kilpatrick Townsend & Stockton LLP

(57) ABSTRACT

A datacenter or other building includes an intake housing for receiving air from outside of the building. The air is routed through an evaporative cooling system in the housing, resulting in humidified air. The humidified air is mixed with a suitable amount of return air from within the building so as to yield a supply of air having a target relative humidity.

22 Claims, 4 Drawing Sheets

(56) References Cited

U.S. PATENT DOCUMENTS

| | | | | |
|---|---|---|---|---|
| 9,055,696 | B2* | 6/2015 | Dunnavant | H05K 7/20745 |
| 2007/0101746 | A1* | 5/2007 | Schlom | F24F 5/0007 |
| | | | | 62/310 |
| 2008/0185446 | A1* | 8/2008 | Tozer | H05K 7/20836 |
| | | | | 236/49.4 |
| 2009/0032981 | A1* | 2/2009 | Graef | F28C 1/04 |
| | | | | 261/112.2 |
| 2009/0046427 | A1* | 2/2009 | Noteboom | H05K 7/20745 |
| | | | | 361/695 |
| 2010/0136895 | A1* | 6/2010 | Sgro | H05K 7/20836 |
| | | | | 454/184 |
| 2010/0188810 | A1* | 7/2010 | Andersen | H05K 7/20745 |
| | | | | 361/679.49 |
| 2012/0298334 | A1* | 11/2012 | Madaffari | H05K 7/20745 |
| | | | | 165/104.13 |
| 2013/0023196 | A1* | 1/2013 | Fisher | F24F 3/14 |
| | | | | 454/254 |
| 2013/0062047 | A1* | 3/2013 | Vaney | H05K 7/20836 |
| | | | | 165/287 |

OTHER PUBLICATIONS

Evaporcool. Brochure [online]. Evaporcool, 2012 [retrieved on Jul. 30, 2015]. Retrieved from the Internet: http://www.evaporcool.com/e-books/Evaporcool-Brochure/#/0, 4 pages.

EcoMesh. Technical Information. [online] EcoMESH, 2015. [retrieved on Jul. 30, 2015]. Retrieved from the Internet: http://www.ecomesh.eu/technical-info/, 2 pages.

\* cited by examiner

COOLING SYSTEM FOR A BUILDING

BACKGROUND

A datacenter is a facility used to house a collection of computer servers and associated components, typically network hardware. The collection of computer servers is often called a "server cluster" or "server farm," and is designed to meet server needs far beyond the capability of a single machine. The networking hardware typically includes network switches and/or routers which enable communication between the different parts of the server farm and the users of the server farm. Datacenters are commonly used for cluster computing, web services, remote data storage, web hosting, and other web services. Datacenters are increasingly being used by enterprises instead of, or in addition to, mainframe computers. As the demand for datacenters continues to increase, a need exists to limit the cost of operating a datacenter. At the same time, there is a need to maintain suitable environmental conditions in the datacenter to reduce risks of equipment failure that may result in unavailability of datacenter computing resources.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various embodiments herein are directed to datacenter cooling systems for controlling air quality characteristics (e.g., relative humidity and temperature). The datacenter systems feature an evaporative cooling system located in a housing external to the datacenter building. The evaporative cooling system adjusts humidity and temperature levels of air conveyed into the building through the housing. This air can be mixed with return air or other air from within the building to further adjust relative humidity and temperature levels. Such systems can provide simplified controls with multiple layers or instances at which adjustments can be made to air quality characteristics, such as relative humidity and temperature. In some embodiments, the datacenter systems include a first bank of filters alongside the evaporative cooling systems and a further bank of filters at a subsequent point within the overall cooling systems. This may facilitate multiple levels of filtering, which can reduce costs. For example, the first level of filtering can reduce debris-loading on the subsequent level of filtering. This can reduce a frequency and attendant cost of replacing higher quality, more expensive filters in the subsequent level of filtering, and allow the first level of filtering to use less expensive filters that can be economically replaced more often.

Figure 1:
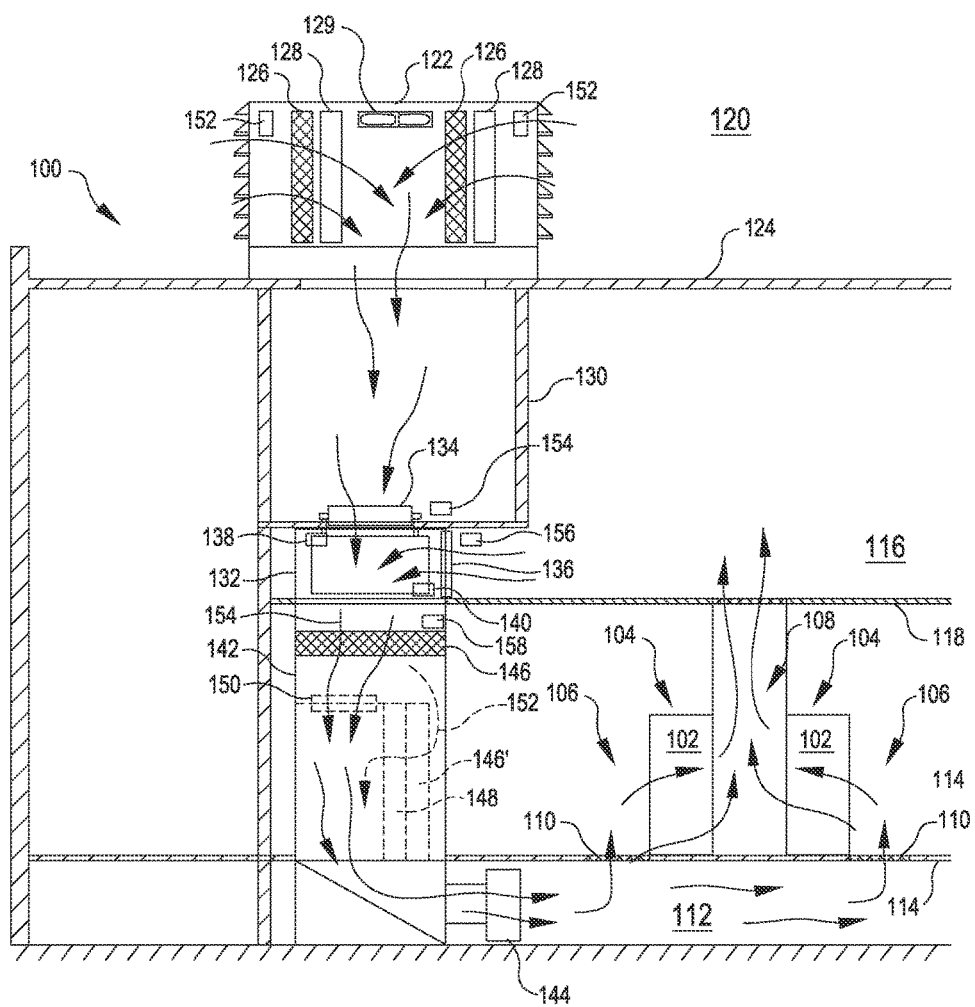
FIG. 1 is a schematic illustration of a datacenter according to certain embodiments.

Referring now to the figures, FIG. 1 illustrates a datacenter 100 in accordance with certain embodiments herein. The datacenter 100 includes computer servers and network hardware, e.g., organized and supported in the server racks 102 in rows 104 shown in FIG. 1. The computer servers and network hardware are arranged between a cold aisle 106 (or other cold area) and a hot aisle 108 (or other hot area). The cold aisles 106 are used for providing cool air for the servers and/or network hardware and for access by workers or administrators. The hot aisles 108 receive heat exhausted from servers and/or networking hardware within the datacenter, e.g., as heat is exhausted away from the server racks 102 and associated components by fans and/or natural convection currents that occur in the datacenter 100.

To aid in airflow, computing devices are arranged so that they draw air from the cold aisles 106 and exhaust into a hot aisle 108. For examples, servers are mounted in server racks 102 in the datacenter 100 so that a front portion, including intake vents for cooling, faces and is exposed to a cold aisle 106. A rear portion, including an exhaust fan, faces a hot aisle 108. In this manner, the server is cooled by drawing cold air from the cold aisle 106 and the air that is heated by the server is exhausted into the hot aisle 108.

In a similar manner, networking hardware can be mounted so that air intake is exposed to the cold aisle 106, with exhaust fans exposed to the hot aisle 108. Because typical networking hardware includes exhaust on a side and an intake on an opposite side, the networking hardware racks are typically turned sideways so that the intake is exposed to the cold aisle 106 for drawing cold air, and the exhaust side is exposed to the hot aisle 108, permitting hot air from the networking hardware to blow into the hot aisle 108.

In operation, the cooling fans of the networking hardware draw cool air from a cold aisle 106 and exhaust hot air into a hot aisle 108. Similarly, the fans for the servers draw air from a cold aisle 106 into a hot aisle 108. Thus, the standard cooling structure supplied for servers and networking hardware provide airflow from the cold aisle 106, through the equipment (e.g., through the server racks 102), and into the hot aisles 108. As used herein, in the specification and claims, "server rack" is utilized to mean either a server rack or a network hardware rack, to avoid having to repeat both throughout the description.

The cold aisles 108 shown in FIG. 1 are supplied with cool air through vents 110 from a cold air plenum 112 located under a floor 114 of the datacenter 100. The corresponding hot aisles 108 vent hot air from the server racks 102 into a hot air plenum 116 located above the ceiling of the room with the server racks 102. The hot air in the hot air plenum 116 can be directed out of the building or recycled into an air supply as return air utilized elsewhere in the datacenter 100.

The cold air in the cold air plenum 112 can originate from an environment 120 outside of the datacenter 100. In the embodiment shown in FIG. 1, the air is first received from the environment 120 into the datacenter 100 through a housing 122. Such housings 122 are often referred to as a louvered penthouse or doghouse. Although shown on the roof 124 of the datacenter 100, the housing 122 may be positioned elsewhere, such as on the sides of the building of the datacenter 100.

Air entering through the housing 122 from the environment 120 can pass through one or more filter banks 126. The filter banks may be positioned so that substantially all entering air passes through the filter banks 126. Each filter bank 126 may include one or more filters for filtering debris or other airborne particulate from the air.

Air entering the housing 122 from the environment 120 can pass through one or more evaporative cooling systems 128. Each evaporative cooling system 128 can expose air to moisture (e.g., water). Such exposure can cool the air and/or change the relative humidity of the air to produce humidified air. For example, exposure to moisture can cool the air as a result of heat in the air being expended in causing the moisture to evaporate. Cooling the air can increase the relative humidity of the air, e.g., due to decreases in air temperature causing corresponding decreases in the air's capacity to retain moisture. The relative humidity level of the air may also rise as a result of the evaporated moisture being retained in the air and increasing a total amount of moisture in the air. Examples of suitable evaporative cooling systems 128 are described in greater detail with respect FIGS. 2-4.

Air entering the housing 122 from the environment 120 may pass through evaporative cooling systems 128 and filter banks 126 in any order. The air may pass through a filter bank 126 before passing through an evaporative cooling system 128 (e.g., as shown on the left side of the housing 122 in FIG. 1, in which the filter bank 126 is positioned external to the cooling system 128). Additionally or alternatively, the air may pass through a filter bank 126 after passing through an evaporative cooling system 128 (e.g., as shown on the right side of the housing 122 in FIG. 1, in which the filter bank 126 is positioned internal to the cooling system 128).

One or more fans 129 or other types of blowers can route the humidified air into a duct 130 inside the datacenter 100. The duct 130 shown in FIG. 1 includes insulation to reduce or prevent heat transfer from air in the hot air plenum 116 to the air in the duct 130. The duct 130 conveys the humidified air to a mixing box 132.

The mixing box 132 can be used to provide an additional layer of tempering the air. For example, the mixing box 132 shown in FIG. 1 allows humidified air from the duct 130 to mix with return air from the hot air plenum 116 (or another source of air in the building). This mixing can adjust conditions of the air within the mixing box, such as altering the relative humidity and/or temperature of the air as a result of the ratio of the air mixed in the mixing box 132. The mixing box 132 illustrated in FIG. 1 adjusts the ratio of air received from different sources by adjusting the position of damper blades 134 and 136. For example, a humidified damper blade 134 can be moved toward or away from a closed position to respectively reduce or increase an amount of humidified air from the housing 122 that is introduced into the mixing box 132. Similarly, the mixing box 132 can move a return damper blade 136 toward or away from a fully opened position to respectively increase or decrease an amount of return air from the hot air plenum 116. The illustrated dampers 134, 136 are regulated by respective actuators 138 and 140 in FIG. 1; however, other types of airflow control structures and/or regulators can be used for adjusting the ratio of air in the mixing box 132.

Use of return air can reduce a demand for fresh air from the environment 120 outside the datacenter 100. Reducing the demand of fresh air can reduce costs of the operating the datacenter 100, such as by reducing a corresponding amount of power used for blowers or by reducing dirt-loading of filters and a corresponding frequency of filter replacement.

Continuing the airflow path through FIG. 1, air from the mixing box 132 is conveyed into the air handling unit 142. The air handling unit 142 includes a fan 144 (or other blower) to supply or move air into the cold air plenum 112.

The air handling unit shown in FIG. 1 has a second filter bank 146. In various embodiments, the second filter bank 146 is positioned within the air handling unit 142 so that all air communicated by the air handling unit will pass through the second filter bank 146. Such an arrangement may allow a difference in filter quality between the first filter bank 126 (that filters air from the environment 120) and the second filter bank 146. For example, the filters in the first filter bank 126 can be rated with a lower MERV (Minimum Efficiency Reporting Value) level than the filters used in the second filter bank 146. The provision of an earlier or upstream filter bank 126 may reduce the dirt load on the second filter bank 146, which can reduce a frequency of replacement for the second filter bank 146. This may reduce costs associated with more expensive and higher quality filters.

Although the second filter bank 146 is illustrated in FIG. 1 at a position near the top of the air handling unit 142, any other suitable location may be used. In some embodiments, the second filter bank 146 may correspond to a filter bank 146' (shown in phantom) that is associated with a bypassable evaporative cooling system 148 (also shown in phantom) located in the air handling unit 142. For example, the air handling unit 142 may be a model of air handling unit 142 that would typically adjust temperature and/or humidity of the air by modulating a bypass damper 150 (also shown in phantom), causing some air to pass through the evaporative system 148 and filter bank 146' (e.g., shown by arrow 152), while other air passes unfiltered through bypass damper 150 (e.g., along a path shown by arrow 154). Such an air handling unit 142 may be retrofit by permanently sealing the bypass damper 150, which can cause all air to flow through the associated filter bank 146' (e.g., along the path of arrow 152). Doing so may result in an arrangement having two filtering levels, allowing the more expensive filters to be replaced less frequently as described above.

The datacenter 100 in FIG. 1 includes various sensors. The sensors can provide air wet bulb readings, air dry bulb readings, air relative humidity readings, and/or other information about air quality at various locations relative to the datacenter 100. This information can be used to determine other actions for bringing quality of air within a desired range (e.g., within a certain threshold of a target temperature and/or relative humidity). In FIG. 1, ambient sensors 152 are located in the housing 120 on the roof 124 of the building; however such sensors may be located in any other location suitable to provide information about quality of air entering from the environment 120. In some embodiments, this information may be used to determine the level of operation of an evaporative system 128 that will bring air within a target quality range. A humidified sensor 154 (e.g., located in the duct 130 in FIG. 1) can indicate air quality of the air that has been through the evaporative cooling systems 128 (e.g., the humidified air). Similarly, a return sensor 156 (e.g., located in the hot air plenum 116 in FIG. 1) can provide information about the quality of return air supplied to the mixing box 132. These two sensors (the humidified sensor 154 and the return sensor 156) can be used to determine suitable amounts of return air and humidified air to mix to obtain a target quality level or range of resultant tempered air. This information may be used in turn to determine levels at which the dampers 134, 136 can be set to achieve that goal. A mixed sensor 158 can be positioned in the air handling unit 142 or in another location suitable for obtaining information about the quality of the air that has been mixed, e.g., which may indicate if any further refinement of the operation of the evaporative cooling system 128 and/or mixing box 132 are warranted to bring the quality of the mixed air within the target range.

Figure 2:
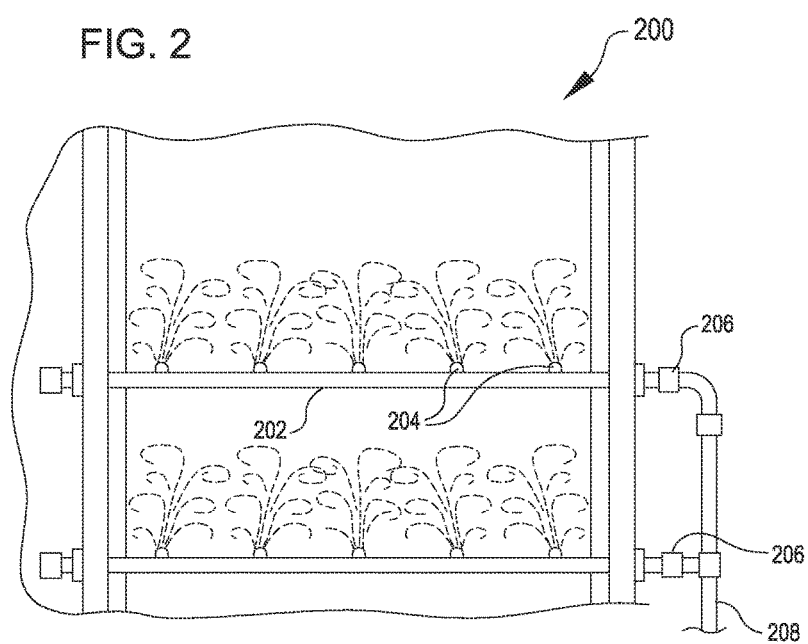
FIG. 2 illustrates one example of an evaporative cooling system that can be used in the datacenter of FIG. 1 according to certain embodiments.

FIG. 2 illustrates one example of an evaporative cooling system 200 that can be used in the datacenter 100 of FIG. 1. The illustrated evaporative cooling system 200 includes rails 202 with nozzles 204. The nozzles 204 can atomize water into an airflow path of the air received in the housing 122. The level of cooling and/or humidification provided by the evaporative cooling system 200 can be changed by changing a number of rails 202 or nozzles 204 in operation at any given time. For example, the depicted rails 202 include valves 206 that can be selectively operated to permit or prevent water passage through particular rails 202 to the respective nozzles 204, thereby changing an amount of water that is introduced into the air through the mist provided by the operational nozzles 204. In various embodiments, the rails 202 are fed by a supply line 208, such as via a high pressure pump from a reverse osmosis filtration plant or other source of high-quality water suitable for atomization into a mist for the evaporative system 200.

Figure 3:
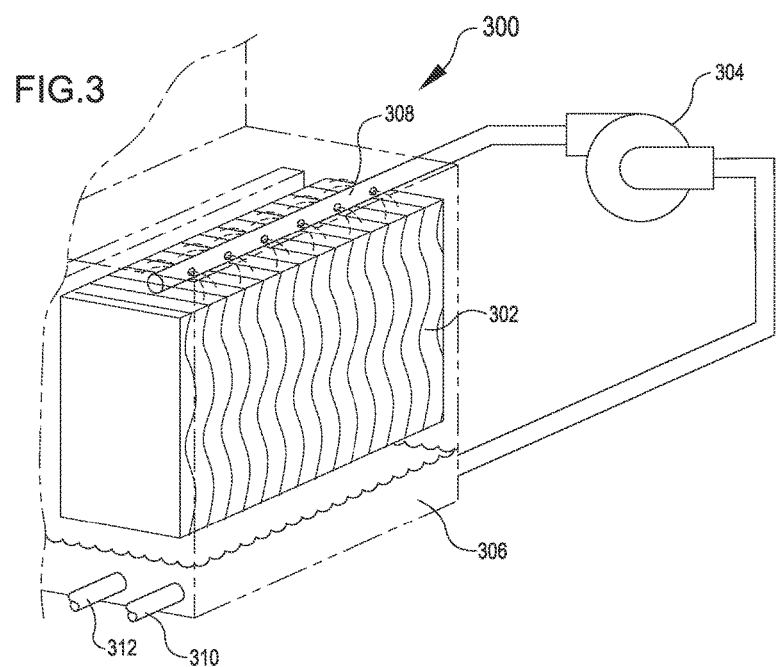
FIG. 3 illustrates another example of an evaporative cooling system that can be used in the datacenter of FIG. 1 according to certain embodiments.

FIG. 3 illustrates another example of an evaporative cooling system 300 that can be used in the datacenter of FIG. 1. The system includes ribs 302 oriented transverse to an airflow path. A pump 304 moves water from a reservoir 306 to a distributor line 308. Water exits the distributor line 308 and travels down the ribs 302 in a cascading fashion, thereby exposing the water to the airflow path and causing a corresponding change to the relative humidity and/or temperature of air travelling the airflow path. The falling or cascading water may also capture particulate in the air, thereby acting as an "air washer" and moving contaminants into the reservoir 306 as the air passes by or through the media that makes up the ribs 302. The reservoir 306 includes an inlet 310 and an outlet 312 through which fresh water can be cycled into the reservoir 306 to maintain a quality of water cascading over the ribs 302. The pump 304 or other control mechanisms can be used to regulate an amount of water introduced to the ribs 302 and/or which ribs 302 or banks of ribs 302 are utilized.

Figure 4:
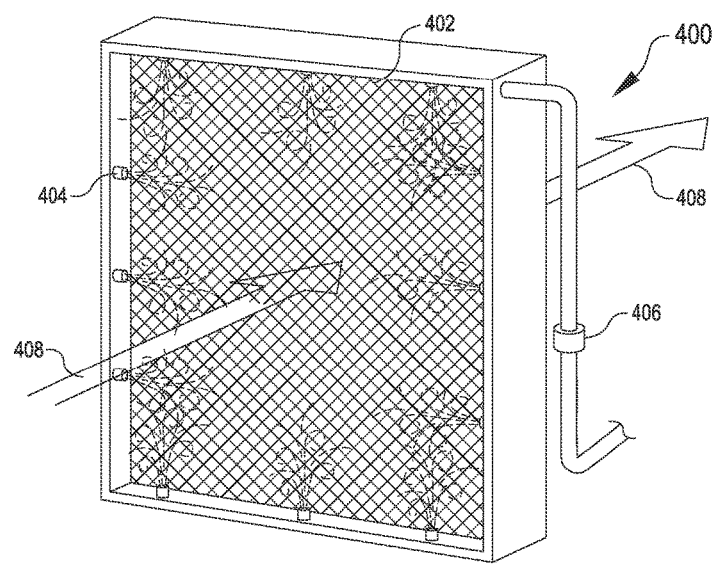
FIG. 4 is a further example of an evaporative cooling system that can be used in the datacenter of FIG. 1 according to certain embodiments.

FIG. 4 illustrates another example of an evaporative cooling system 400 that can be used in the datacenter 100 of FIG. 1. The evaporative cooling system 400 includes a mesh surface 402. The mesh surface includes a fibrous or mesh material with a large amount of surface area over the individual strands of the surface 402. Nozzles 404 apply water to the mesh surface 402 in bursts to expose the airflow path (illustrated by arrows 408) to moisture. Operation of a solenoid valve 406 or other control feature can regulate the frequency, intensity, and/or duration of the bursts to adjust an amount of water used by the evaporative cooling system 400.

In various aspects, the evaporative cooling system 400 illustrated in FIG. 4 is effective when placed outside or external to a filter bank 126 (e.g., as shown on the right side of FIG. 1). This arrangement may provide an additional level of filtering as a result of the mesh surface of the evaporative cooling system 400. In some embodiments, the evaporative cooling system 300 of FIG. 3 can similarly be positioned external to a filter bank 126, e.g., to provide an additional level of filtering through the ribs 302. In various embodiments, the evaporative cooling system 200 of FIG. 1 can be positioned internal to a filter bank 126 in FIG. 1, such as to treat air only after being filtered.

Figure 5:
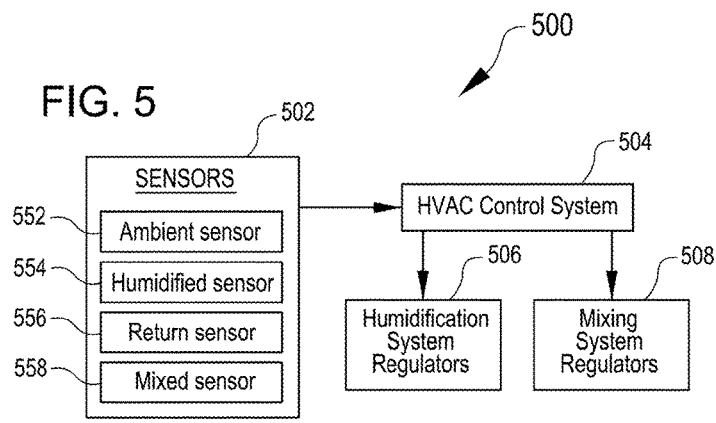
FIG. 5 is a block diagram illustrating components that can be used to control air quality characteristics according to certain embodiments.

FIG. 5 illustrates a block diagram of a system 500 for controlling air quality characteristics according to some aspects. The system 500 can include a HVAC control system 504 that can receive information from sensors 502. As non-limiting examples, the sensors 502 can include any combination of an ambient sensor 552, a humidified sensor 554, a return sensor 556, or a mixed sensor 558 (any or all of which may correspond to sensors of the same name described with respect to FIG. 1). Based on information from the sensors 502 (e.g., information from any individual sensor or combination of sensors therein), the HVAC control system 504 controls humidification system regulators 506 and mixing system regulators 508. The humidification system regulators 506 can control an amount of moisture provided by evaporative cooling systems 128. Non-limiting examples of humidification system regulators 506 include the valves 206, the pump 304, and the solenoid valve 406 described with respect to other figures herein. The mixing system regulators 508 can control an amount of mixing of air sources, e.g., in the mixing box 132. Non-limiting examples of the mixing system regulators 508 include the actuators 138, 140 described above with respect to movement of the dampers 134, 136 in FIG. 1. The HVAC control system 504 can operate the humidification system regulators 506 and mixing system regulators 508 so as to obtain a target quality of tempered air. For example, the HVAC control system 504 may control components so as to change an amount of moisture introduced by an evaporative cooling system 128 and/or change an amount of return air combined with humidified air to produce tempered air of a target quality.

The HVAC control system 504 can include computing devices, such as server computers or desktop computers, configured with various hardware and software modules to implement the functionality and/or processes described herein. The computing devices generally include a processor and a computer-readable storage medium or memory storing instructions that, when executed by the processor, allow the computing device to perform its intended functions. The memory generally includes RAM, ROM, and/or other persistent or non-transitory memory. In one example, a user (e.g., a datacenter administrator or a HVAC technician) may use a computing device to adjust parameters to alter a manner in which cooling systems function, such as by modifying goal temperatures, triggering events, timing, and/or other characteristics of the cooling system operation. In some embodiments, computing devices can additionally or alternatively operate automatically, without ongoing input from a user. For example, the HVAC control system 502 may automatically process information from sensors 502 and respond by controlling elements associated with the building, such as the humidification system regulators 506 and/or the mixing system regulators 508.

Figure 6:
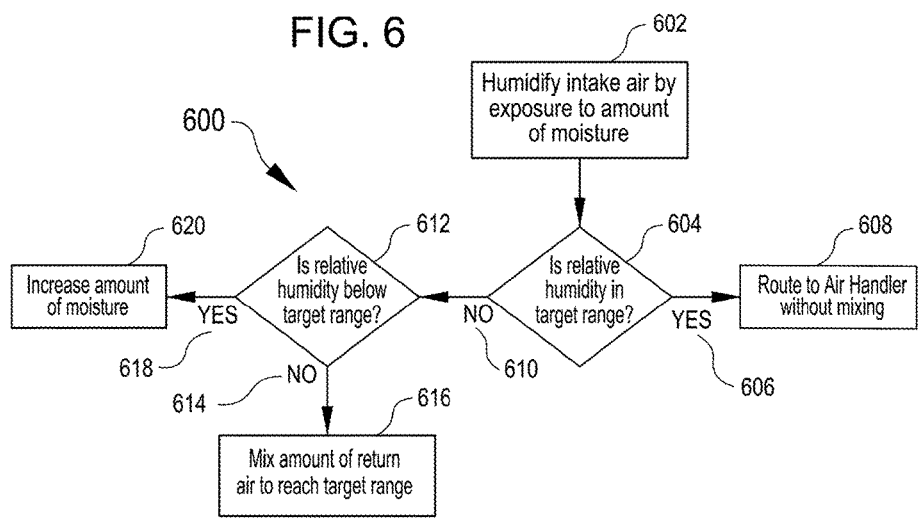
FIG. 6 is a flowchart illustrating a process for controlling air quality characteristics according to certain embodiments.

FIG. 6 is a flowchart illustrating a process 600 for controlling air quality characteristics according to certain embodiments. At block 602, the process 600 involves humidifying intake air by exposure to an amount of moisture. For example, the intake can correspond to the intake housing 122 of the datacenter of FIG. 1, and the amount of moisture can be added by routing the air through an evaporative cooling system 128 located in the housing 122 so as to produce humidified air. The amount of moisture can be determined by a level at which the evaporative cooling system 128 is operated. For example, the amount of moisture may be increased or decreased by changing e.g., a number of rails 202 receiving water through valves 206 in FIG. 2; a number of ribs 308 or banks of ribs 308 receiving water through distributor lines 308 in FIG. 3; a frequency, duration, or intensity of bursts provided to the mesh surface 402 in FIG. 4; etc. The operating level of the cooling system 128 (and the corresponding amount of moisture introduced) may be based on conditions (such as relative humidity and/or temperature) of air in the environment outside of the building, of humidified air that has been humidified by passage through an evaporative cooling system, of return air, of tempered air that is a mixture of humidified air and return air, or any combination of these options.

At block 604, the process 600 includes determining if the relative humidity of the humidified air is within a target range. For example, the relative humidity may be determined based on information from a humidified sensor 154 or 554. As an illustrative example, the HVAC control system 504 may use such information to determine if the relative humidity is within a target range of 75%-80% relative humidity. However, any other range may be used, including ranges with higher or lower endpoints and/or endpoints that are a greater or smaller distance apart from one another.

If the relative humidity is in the target range (Y at 606), the process 600 proceeds to block 608, and the humidified air is routed to an air handler (e.g., 142 in FIG. 1) without mixing with return air. For example, with respect to FIG. 1, the actuator or other regulator 140 may set the damper 136 to a fully closed position so that no return air from the hot air plenum 116 is mixed with humidified air from the housing 122 when passing from the duct 130 through the mixing box 132 into the air handling unit 142.

If the relative humidity is not in the target range (N at 610), the process 600 proceeds to block 608. At block 608, the process 600 includes determining if the relative humidity of the humidified air is below the target range. For example, this determination may be made based on information from a humidified sensor 154.

If the relative humidity is above the target range (N at 614), the process 600 proceeds to block 616. Returning to the earlier illustrative example, if an evaporative cooling system 128 produces humidified air with a relative humidity of 95% when the target range is 75%-80%, the process may proceed to block 616. At block 616, the process 600 includes mixing an amount of return air to reach the target range. For example, the HVAC control system 504 may use information from the humidified sensor 504 and the return sensor 556 to determine respective amounts of humidified and return air that will combine when mixed to produce mixed air of a target relative humidity. The HVAC control system 504 can accordingly operate the mixing system regulators 508 (such as the actuators 138, 140 controlling the dampers 134, 136 of FIG. 1) so as to cause those respective amounts of humidified and return air to be introduced into and mixed within the mixing box 132 of FIG. 1. Returning again to the earlier illustrative example, the HVAC control system 504 may determine that tempered air within the target range of 75%-80% relative humidity can be obtained by mixing the humidified air (with 95% relative humidity) at a ratio of two parts humidified air to three parts return air and control the dampers 134, 136 of the mixing box accordingly to introduce such a ratio.

If the relative humidity is below the target range (Y at 618), the process 600 proceeds to block 620. At block 620, the process 600 includes increasing the amount of moisture introduced, e.g., at block 602. As non-limiting examples, this may include increasing a number of rails 202 receiving water through valves 206 in FIG. 2; increasing a number of ribs 308 or banks of ribs 308 receiving water through distributor lines 308 in FIG. 3; or increasing a frequency, duration, or intensity of bursts provided to the mesh surface 402 in FIG. 4. As may be appreciated, although block 620 corresponds to increasing the amount of moisture in response to conditions of the humidified air, the process can additionally or alternatively include increasing or decreasing the amount of moisture based on any combination of detected conditions of the air outside of the building, the air that has been humidified, the return air, or the mixed or tempered air.

Although the description herein is primarily directed to datacenters, the scope of the disclosure is not so limited and is relevant to other types of buildings as well.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A datacenter comprising:
   a building comprising a roof and a room containing computer servers or network hardware, the computer servers or network hardware being arranged between a cold area and a hot area such that air passage from the cold area across the computer servers or network hardware carries heat from the computer servers or network hardware to the hot area;
   a louvered penthouse comprising a housing located on the roof for receiving intake air from an environment outside of the building, the louvered penthouse further comprising an evaporative cooling system configured to add moisture to the intake air received in the louvered penthouse from the environment to produce humidified air, the louvered penthouse further comprising a first filter bank configured to filter the intake air received in the louvered penthouse from the environment;
   a mixing box configured to selectively mix the humidified air received from the louvered penthouse with return air received from the hot area of the room to produce tempered air;
   an air handling unit configured to move the tempered air from the mixing box toward the cold area of the room, the air handling unit comprising a second filter bank, the air handling unit configured to direct all the tempered air received from the mixing box through the second filter bank; and
   a control system configured to adjust a relative humidity of the tempered air directed from the mixing box toward the cold area of the room to be within a target relative humidity range by selectively performing one or more available operations selected from among:
      increasing an amount of humidity added by the evaporative cooling system to the intake air received through the louvered penthouse so as to increase the relative humidity of the tempered air toward or with respect to the target relative humidity range;
      decreasing, via control of the mixing box, mixing of the return air with the humidified air from the evaporative cooling system so as to increase the relative humidity of the tempered air toward or with respect to the target relative humidity range;
      decreasing an amount of humidity added by the evaporative cooling system to the intake air received through the louvered penthouse so as to decrease the relative humidity of the tempered air toward or with respect to the target relative humidity range; and
      increasing, via control of the mixing box, mixing of the return air with the humidified air from the evaporative cooling system so as to decrease the relative humidity of the tempered air toward or with respect to the target relative humidity range.

2. The datacenter of claim 1, wherein the evaporative cooling system comprises one or more nozzles configured to atomize water into an airflow path of the intake air received in the louvered penthouse.

3. The datacenter of claim 1, wherein the evaporative cooling system comprises one or more mesh surfaces configured to receive bursts of water and located in an airflow path of the intake air received in the louvered penthouse.

4. The datacenter of claim 1, wherein the evaporative cooling system comprises one or more ribs configured to vertically direct a flow of water and located in an airflow path of the intake air received in the louvered penthouse.

5. The datacenter of claim 1, wherein the second filter bank comprises one or more filters with a higher MERV rating than one or more filters of the first filter bank.

6. A cooling system for a building, the cooling system comprising:
   an intake housing configured to receive intake air from an environment outside of the building;
   an evaporative cooling system configured to add moisture to the intake air received from the intake housing so as to produce humidified air;
   a mixing box configured to produce tempered air by selectively mixing the humidified air with return air received from a room within the building;
   an air handling unit configured to move the tempered air toward the room; and
   a control system configured to adjust a relative humidity of the tempered air directed from the air handling unit toward the room to be within a target relative humidity range by selectively performing one or more available operations selected from among:
      increasing an amount of humidity added by the evaporative cooling system to the intake air received through the intake housing so as to increase the relative humidity of the tempered air toward or with respect to the target relative humidity range;
      decreasing, via control of the mixing box, mixing of the return air with the humidified air from the evaporative cooling system so as to increase the relative humidity of the tempered air toward or with respect to the target relative humidity range;
      decreasing an amount of humidity added by the evaporative cooling system to the intake air received through the intake housing so as to decrease the relative humidity of the tempered air toward or with respect to the target relative humidity range; and
      increasing, via control of the mixing box, mixing of the return air with the humidified air from the evaporative cooling system so as to decrease the relative humidity of the tempered air toward or with respect to the target relative humidity range.

7. The cooling system of claim 6, further comprising a filter bank configured to filter the intake air received in the intake from the environment, wherein the evaporative cooling system is positioned so as to add moisture to the intake air received from the intake through the filter bank.

8. The cooling system of claim 7, wherein the evaporative cooling system comprises:
   one or more nozzles configured to atomize water into an airflow path.

9. The cooling system of claim 6, further comprising a filter bank configured to filter humidified air received in the intake from the environment after moisture has been added to the humidified air by the evaporative cooling system.

10. The cooling system of claim 9, wherein the evaporative cooling system comprises:
    one or more mesh surfaces configured to receive bursts of water and located in an airflow path; or
    one or more ribs configured to vertically direct a flow of water and located in the airflow path.

11. The cooling system of claim 6, wherein the room comprises computer servers or network hardware.

12. The cooling system of claim 6, wherein the intake is located along a roof of the building.

13. The cooling system of claim 6, wherein the mixing box is configured to receive return air through a ceiling plenum and the air handling unit is configured to move the tempered air toward the room through a floor plenum.

14. A method comprising:
controlling a relative humidity of tempered air delivered to a room of a building to be within a target relative humidity range by selectively performing one or more available operations selected from among:
increasing an amount of humidity added by an evaporative cooling system located in an intake housing of the building to intake air received through the intake housing so as to increase the relative humidity of the tempered air toward or with respect to the target relative humidity range;
decreasing mixing of return air with humidified air from the evaporative cooling system so as to increase the relative humidity of the tempered air toward or with respect to the target relative humidity range, the return air routed from the room;
decreasing an amount of humidity added by the evaporative cooling system located in the intake housing of the building to the intake air received through the intake housing so as to decrease the relative humidity of the tempered air toward or with respect to the target relative humidity range; and
increasing mixing of the return air with the humidified air from the evaporative cooling system so as to decrease the relative humidity of the tempered air toward or with respect to the target relative humidity range.

15. The method of claim 14, wherein the amount of humidity added is adjusted by changing a number of nozzles that are receiving water, the nozzles configured to atomize received water into an airflow path of the intake air received through the intake housing.

16. The method of claim 14, wherein the amount of humidity added is adjusted by changing a number of ribs that are receiving water, the ribs configured to vertically direct a flow of water across an airflow path of the intake air received through the intake housing.

17. The method of claim 14, wherein the amount of humidity added is adjusted by changing a frequency, duration, or intensity of bursts of water provided to one or more mesh surfaces located in an airflow path of the intake air received through the intake housing.

18. The method of claim 14, wherein the amount of humidity added is adjusted based on one or more detected conditions of the intake air in an environment outside of the building.

19. The method of claim 14, wherein the amount of humidity added is adjusted based on a detected condition of the humidified air.

20. The method of claim 14, wherein the amount of humidity added is adjusted based on a detected condition of the return air.

21. The method of claim 14, wherein the room contains computer servers or network hardware, the computer servers or network hardware being arranged between a cold area and a hot area such that air passage from the cold area across the computer servers or network hardware carries heat from the computer servers or network hardware to the hot area.

22. The method of claim 14, further comprising moving the tempered air of the target relative humidity range toward the room of the building by operation of an air handling unit.

* * * * *